United States Patent
Hirota et al.

[11] Patent Number: 5,945,843
[45] Date of Patent: Aug. 31, 1999

[54] SEMICONDUCTOR INTEGRATED CIRCUIT

[75] Inventors: Takanori Hirota; Yasushi Hayakawa, both of Tokyo, Japan

[73] Assignee: Mitsubishi Denki Kabushiki Kaisha, Tokyo, Japan

[21] Appl. No.: 08/950,421

[22] Filed: Oct. 24, 1997

[30] Foreign Application Priority Data

Jul. 1, 1997 [JP] Japan ................................. 9-176151

[51] Int. Cl.$^6$ .......................................... H03K 19/0175
[52] U.S. Cl. ........................... 326/66; 396/67; 396/73; 396/77
[58] Field of Search .................. 326/64, 66, 67, 326/68, 73, 74, 75, 77, 78, 18, 84, 109, 110

[56] References Cited

U.S. PATENT DOCUMENTS

| | | | |
|---|---|---|---|
| 4,782,467 | 11/1988 | Belt et al. | 365/154 |
| 5,148,059 | 9/1992 | Chen et al. | |
| 5,561,382 | 10/1996 | Ueda et al. | 326/66 |
| 5,635,859 | 6/1997 | Yokota et al. | 326/67 |

OTHER PUBLICATIONS

Yusuke Ohtomo et al., "A Low Power CMOS–ECL Level Converter," *The Institute of Electronics, Information and Communication Engineers,* Spring 1993, pp. 5–207, (English translation of relevant portion attached).

*Primary Examiner*—Michael Tokar
*Assistant Examiner*—Anh Q. Tran
*Attorney, Agent, or Firm*—Burns, Doane, Swecker & Mathis, LLP

[57] ABSTRACT

A level conversion circuit as a semiconductor integrated circuit has a first load resistance (R1), a second load resistance (R2), a first NMOS transistor (MN3) and a second NMOS transistor (MN4) connected to them (R1 and R2) in parallel, respectively, that are driven directly by positive CMOS level signals, a first bipolar transistor (Q1), and a second bipolar transistor (Q2). Both emitters of the first and second bipolar transistors (Q1 and Q2) are connected commonly, and a voltage potential that is lower than a voltage potential of a collector of the first bipolar transistor (Q1) by a predetermined voltage potential is supplied into a base of the second bipolar transistor (Q2).

12 Claims, 10 Drawing Sheets

SEMICONDUCTOR INTEGRATED CIRCUIT

BACKGROUND OF THE INVENTION

1. Field of the Invention

The present invention relates to a semiconductor integrated circuit as a level conversion circuit comprising bipolar transistors and metal oxide semiconductor (MOS) transistors for converting positive complementary metal oxide semiconductor (CMOS) level signals to low current mode logic level (LCML) signals (it's range is from 0 V to 3 V, for example) or emitter coupled logic (ECL) level signals (it's range is from −0.9 V to −1.7 V, for example).

2. Description of the Prior Art

Figure 1:
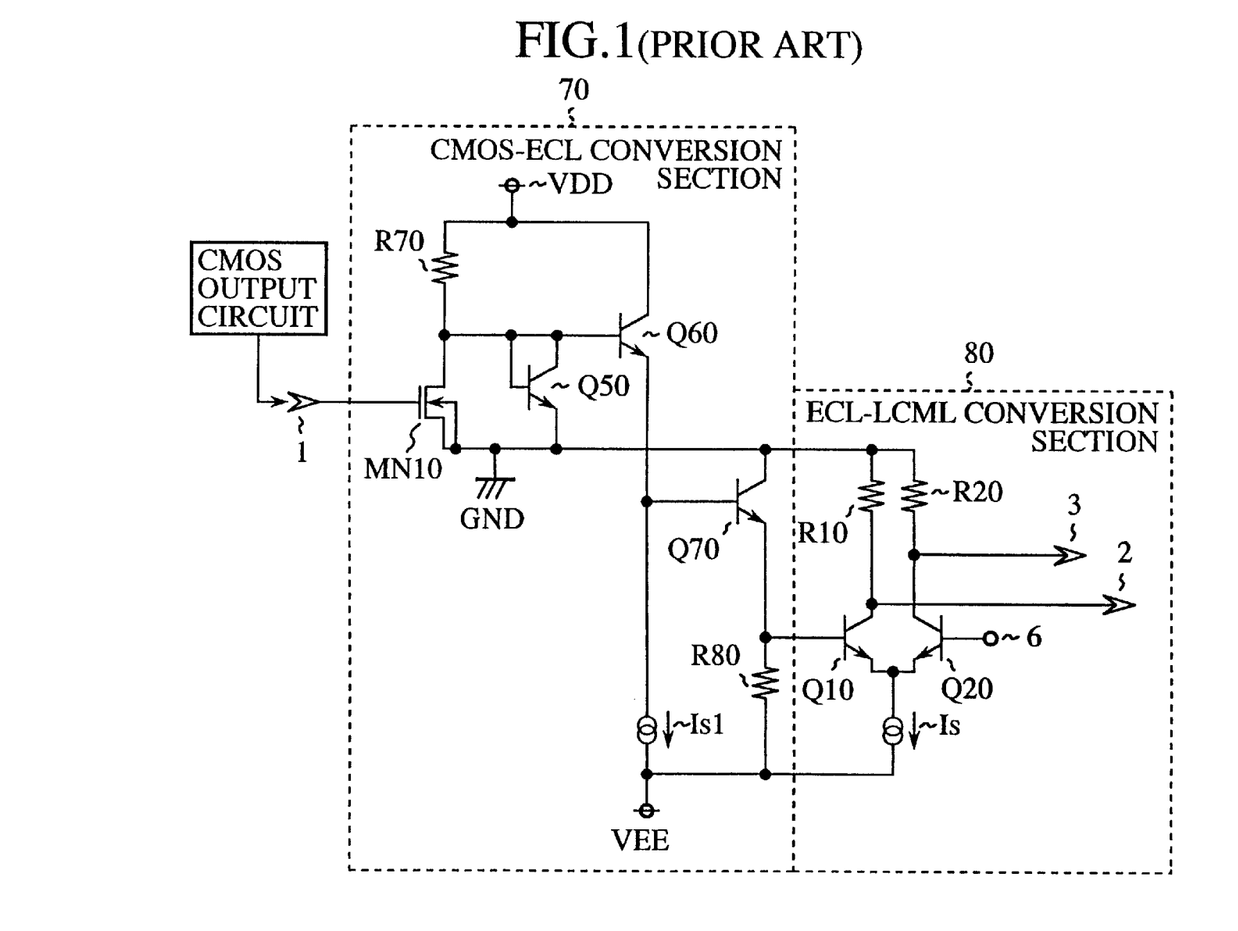
FIG. 1 is a circuit diagram showing a configuration of a conventional level conversion circuit for converting positive CMOS level signals to negative LCML level signals.

FIG. 1 is a circuit diagram showing a configuration of a conventional level conversion circuit (or a level converter) for converting positive CMOS level signals to negative LCML level signals. In FIG. 1, the reference character VDD designates a voltage potential of a positive power source, VEE denotes a voltage potential of a negative power source, GND indicates a voltage potential of a ground power source. The reference character 1 designates an input terminal through which a positive CMOS voltage level (for example, a high (H) level is a voltage of a positive power source and a low level L is a voltage of the ground source) is inputted. The reference number 2 denotes an non-inverted output terminal through which a negative LCML level signal (for example, the H level is a ground voltage level and the L level is −0.3 V) is output to outside. The reference number 3 designates an non-inverted output terminal for outputting the LCML level signals. The reference number 6 denotes a supply terminal of a reference voltage VBB (for example, VBB is −1.3 V). The reference characters Q10, Q20, Q50, Q60 and Q70 designate NPN transistors (bipolar transistors), MN10 denotes a NMOS transistor, R10, R20, R70, and R80 indicate electrical resistance elements as load resistance elements, and Is and Is1 indicate constant power sources. The reference number 70 designates a CMOS-ECL conversion section for converting positive CMOS level signals output from a CMOS output circuit to negative ECL level signals, and 80 denotes a ECL-LCML conversion section for converting negative ECL level signals to negative LCML level signals.

Figure 2:
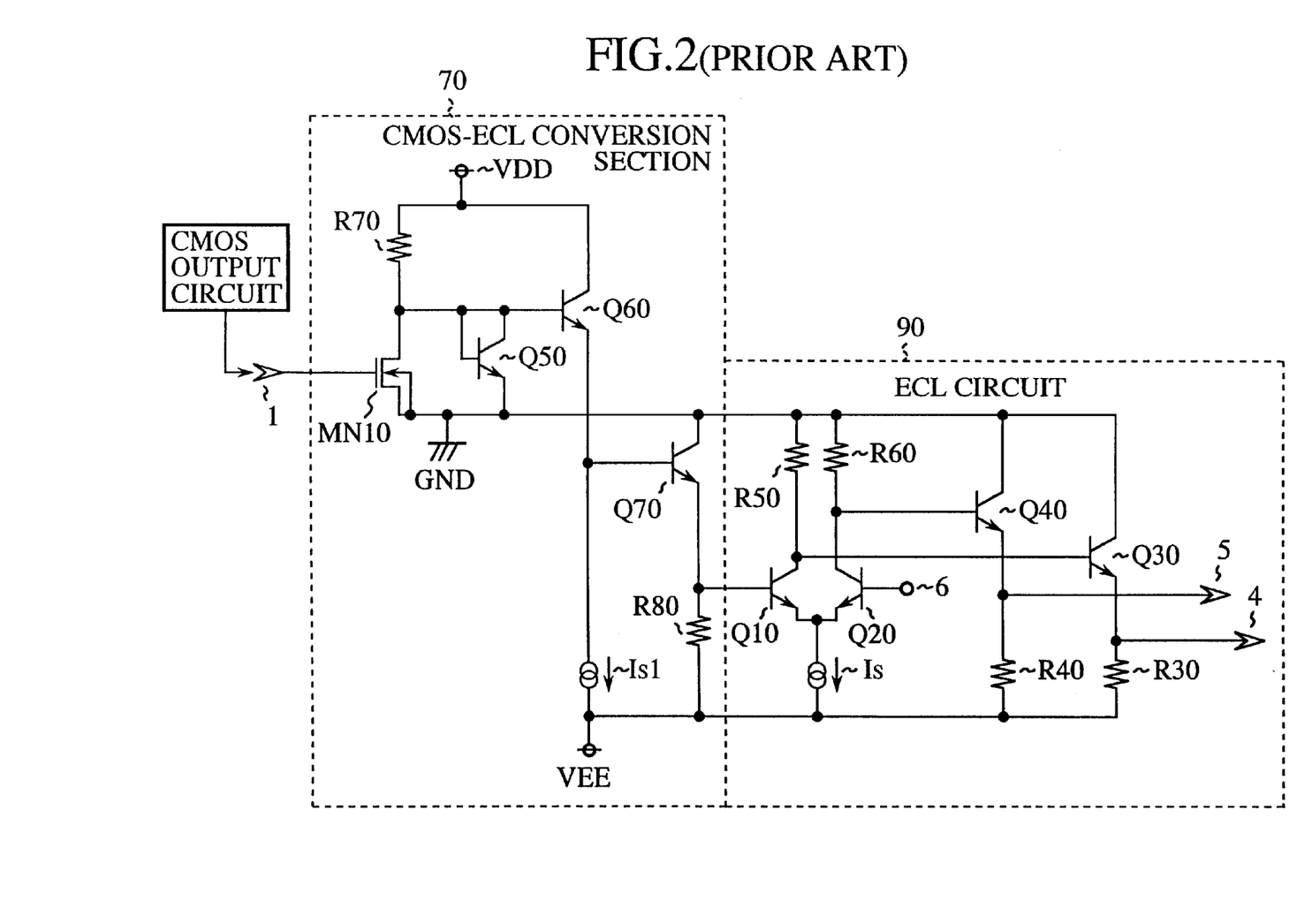
FIG. 2 is a circuit diagram showing a configuration of another conventional level conversion circuit for converting positive CMOS level signals to negative ECL level signals.

FIG. 2 is a circuit diagram showing a configuration of another conventional level conversion circuit for converting positive CMOS level signals to negative ECL level signals. In FIG. 2, the reference character VDD designates a voltage potential of a positive power source and VEE denotes a voltage potential of a negative power source, and GND indicates a voltage potential of a ground power source. The reference number 1 designates an input terminal through which a positive CMOS level signal is inputted. The reference number 4 denotes an non-inverted output terminal through which a negative ECL level signal (for example, the H level is −0.9 V and the L level is −1.7 V) is output, 5 denotes an non-inverted output terminal through which a ECL level signal is output, and 6 indicates a supply terminal through which a reference voltage potential VBB (for example, VBB is −1.3 V) is supplied. The reference characters Q10, Q20, Q30, Q40, Q50, Q60, and Q70 designate NPN transistors, MN10 indicates a NMOS transistor, R30, R40, RS0, R60, R70, and R80 designate electrical resistance elements. The reference characters Is and Is1 denote constant current sources, 70 designates a CMOS-ECL conversion section for converting positive CMOS level signals output from the CMOS output circuit to negative ECL level signals, and 90 indicates an ECL circuit Next, a description will now be given of the conventional level conversion circuit.

The following description will explain both cases in which a positive CMOS level signal to be inputted to the input terminal 1 has both levels, the H voltage potential level and the L voltage potential level. Because the MOS transistor MN10 becomes ON when the positive CMOS level to be inputted into the input terminal 1 is the H level, a voltage potential of the emitter terminal of the NPN transistor Q60 is reduced by the voltage potential VBB (a forward voltage between a base and an emitter is approximately 0.8 V) from the ground voltage potential. A voltage potential of the emitter terminal of the NPN transistor Q70 as an input of the ECL-LCML conversion section 80 is reduced by the voltage potential VBE (−2.0 V) from the ground potential. This voltage potential of the emitter terminal of the NPN transistor Q70 is lower than the reference voltage potential VBB, the current Is flows through the NPN transistor Q20. Thereby, the voltage potential of the non-inverted output terminal 2 becomes the H level (as the level of the ground voltage potential) and the voltage potential of the LCML non-inverted output terminal 3 becomes the L level (for example, −0.3 V) because a voltage drop determined by the magnitude of the current Is and the value of the load resistance R20 occurs.

Furthermore, because the MOS transistor MN10 becomes ON when the positive CMOS level to be inputted into the input terminal 1 is the L level, the current flows from the power source VDD through the NPN transistor Q50 as a diode and the voltage potential of the base terminal of the NPN transistor Q60 becomes VBE. Accordingly, the voltage potential of the emitter terminal of the NPN transistor Q70 becomes −VBE. Because the voltage potential of the emitter terminal of the NPN transistor Q70 is higher than the reference voltage potential VBB, the constant current Is flows through the NPN transistor Q10. Accordingly, the voltage potential of the non-inverted output terminal 2 of the LCML level becomes the L level, and the voltage potential of the non-inverted output terminal 3 of the LCML level becomes the H level.

Because the principle of operation of the conventional level conversion circuit shown in FIG. 2 is the same as that of the conventional level converter shown in FIG. 1, the explanation of the principle of operation will be omitted here. Specifically, when both the conventional level conversion circuits shown in FIGS. 1 and 2, the magnitude of a voltage drop in the conventional conversion circuit shown in FIG. 2, that is determined by the magnitude of the constant current Is and the magnitude of the load resistances R50 and R60, becomes larger (for example, it becomes 0.8 V) than that of the conventional level conversion circuit shown in FIG. 1. It is therefore required for the conventional conversion circuit shown in FIG. 2 to further incorporate an emitter follower output circuit for level shift operation.

The voltage potential of each of the non-inverted output terminals 4 and 5 as the ECL output terminal becomes −0.9 V in the H level and −1.7 V in the L level.

Because the conventional level conversion circuits as semiconductor integrated circuits have the above configurations and the positive CMOS voltage level is converted into ECL voltage level before the negative LCML voltage level or the negative ECL voltage level, it is required to incorporate an extra gate, for example, it comprising the NPN transistors Q60, Q70, the constant current source Is1, and the load resistance R80. This conventional configuration of the level conversion circuit causes the increasing of both the delay time of operation and the power consumption, and it is also difficult to increase the degree of the integration of the level conversion circuit as a semiconductor integrated circuit.

SUMMARY OF THE INVENTION

Accordingly, an object of the present invention is, with due consideration to the drawbacks of the conventional level conversion circuit, to provide a level conversion circuit as a semiconductor integrated circuit that is capable of reducing a signal delay time, to reduce a power consumption, and to increase the degree of the integration of the semiconductor integrated circuit.

In accordance with a preferred embodiment of the present invention, a semiconductor integrated circuit comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, and a first bipolar transistor and a second bipolar transistor connected in series to the pair of the first NMOS transistor and the first load resistance connected in parallel and the pair of the second NMOS transistor and the second load resistance connected in parallel, respectively. In the semiconductor integrated circuit, both emitters of the first bipolar transistor and the second bipolar transistor are connected commonly and a voltage potential that is lower than a voltage potential of a collector of the first bipolar transistor by a predetermined voltage potential is supplied into a base of the second bipolar transistor. It is thereby possible to convert the positive CMOS level signals of a positive feed back into negative LCML level signals within a small delay time at a high speed rate and to reduce the power consumption of the semiconductor integrated circuit.

The semiconductor integrated circuit as another preferred embodiment of the present invention, further comprises a third bipolar transistor whose base is connected to a source of the second NMOS transistor and whose emitter is connected to a base of the first bipolar transistor, and a fourth bipolar transistor whose base is connected to a collector of the first bipolar transistor and for providing a voltage potential that is lower than a voltage potential of the collector of the first bipolar transistor into a base of the second bipolar transistor. It is thereby possible to convert the CMOS level signals of a positive feed back into negative LCML level signals within a small delay time at a high speed rate and to reduce the power consumption of the semiconductor integrated circuit.

In accordance with another preferred embodiment of the present invention, a semiconductor integrated circuit, comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, a first bipolar transistor connected in series to the pair of the first NMOS transistor and the first load resistance connected in parallel, and a second bipolar transistor connected in series to the pair of the second NMOS transistor and the second load resistance connected in parallel. In the semiconductor integrated circuit, both emitters of the first bipolar transistor and the second bipolar transistor are connected commonly, and a voltage potential of a collector of the first bipolar transistor is provided into a base of the second bipolar transistor. It is thereby possible to convert the positive CMOS level signals of a positive feed back into negative LCML level signals within a small delay time at a high speed rate and to reduce the power consumption of the semiconductor integrated circuit.

In accordance with another preferred embodiment of the present invention, a semiconductor integrated circuit comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, a first bipolar transistor connected in series to the pair of the first NMOS transistor and the first load resistance connected in parallel, and a second bipolar transistor connected in series to the pair of the second NMOS transistor and the second load resistance connected in parallel. In the semiconductor integrated circuit, both emitters of the first bipolar transistor and the second bipolar transistor are connected commonly, and a voltage potential that is lower than a voltage potential of a collector of the first bipolar transistor by a predetermined voltage potential is provided into a base of the second bipolar transistor. It is thereby possible to convert the positive CMOS level signals of a positive feed back into negative ECL level signals within a small delay time at a high speed rate and to reduce the power consumption of the semiconductor integrated circuit.

In the semiconductor integrated circuit as another preferred embodiment of the present invention, both back gates of the first NMOS transistor and the second NMOS transistor are connected directly to a voltage potential of a power source. It is thereby possible to reduce the number of fabrication processes for the semiconductor integrated circuit.

In the semiconductor integrated circuit as another preferred embodiment of the present invention, a source and a back gate of the first NMOS transistor are connected to each other, and a source and a back gate of the second NMOS transistor are connected to each other. It is thereby possible to convert the positive CMOS level signals of the positive feed back into negative LCML level signals or negative ECL level signals within a small delay time at a high speed rate.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the level conversion circuit as a semiconductor integrated circuit according to the present invention will now be described with reference to the drawings.

First Embodiment

Figure 3:
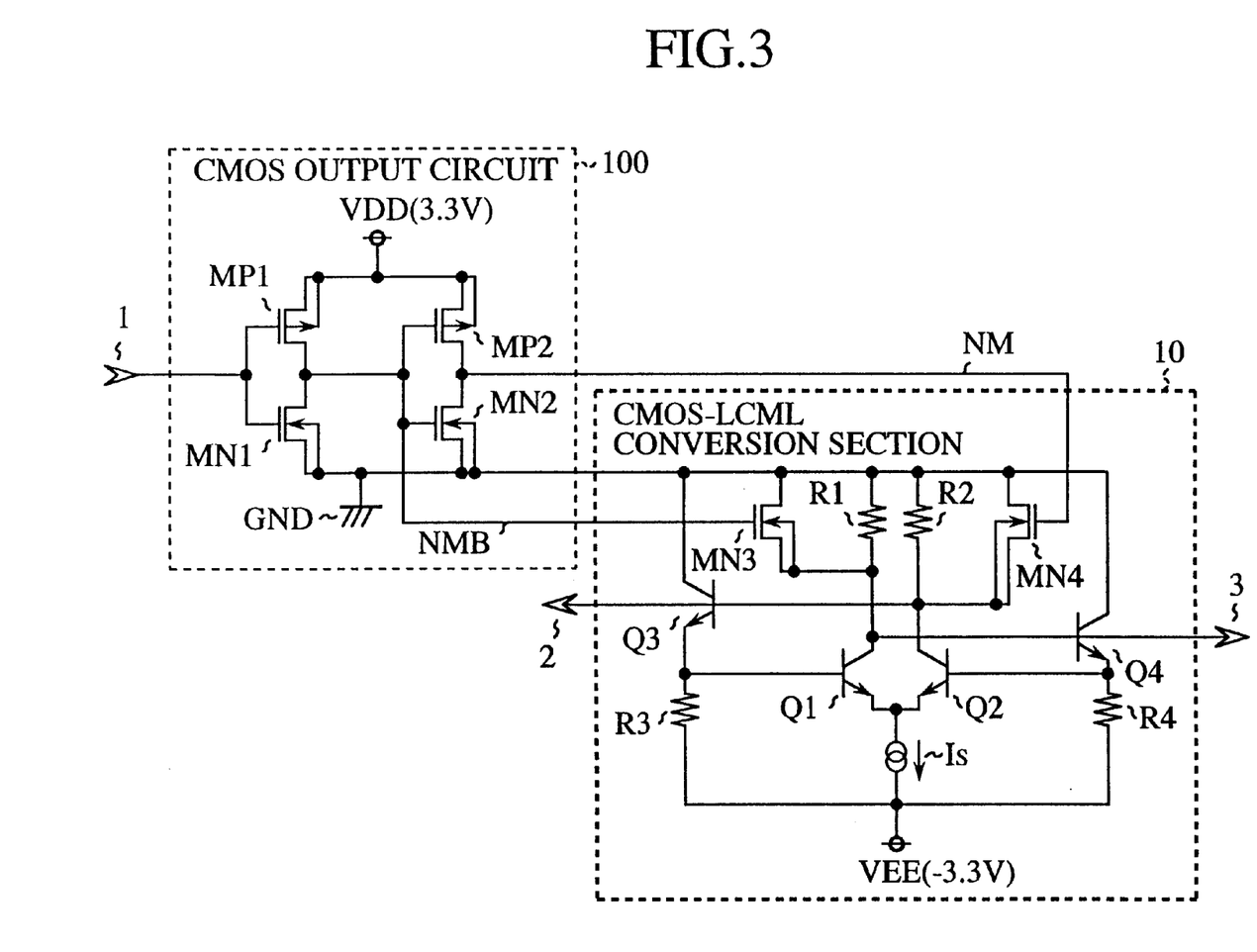
FIG. 3 is a circuit diagram showing a configuration of a level conversion circuit as a semiconductor integrated circuit according to the first embodiment of the present invention.

FIG. 3 is a circuit diagram showing a configuration of a level conversion circuit (as a semiconductor integrated circuit) according to the first embodiment of the present invention. In FIG. 3, the reference character VDD designates a voltage potential of a positive power source (for example, 3.3 V), VEE denotes a voltage potential of a negative power source (for example, −3.3 V), GND indicates a ground voltage potential. The reference character 1 designates an input terminal to input or to receive signals of a positive CMOS potential level (for example, a High (H) potential level is a voltage potential of a positive power source and a low (L) potential level is a voltage potential of a negative power source). The reference number 2 denotes an non-inverted output terminal for outputting negative low current mode logic level (LCML), for example, H level is a ground voltage potential and L level is −0.3 V, and 3 denotes an non-inverted output terminal for outputting LCML voltage potential level signals.

The reference characters Q1 to Q4 designate NPN transistors (a first bipolar transistor, a second bipolar transistor, a third bipolar transistor, and a fourth bipolar transistor, respectively), MP1 and MP2 denote p conductivity type metal oxide semiconductor transistors (hereinafter, referred to as PMOS transistors). Specifically, MN3 indicates a NMOS transistor (a first NMOS transistor), MN4 designates a NMOS transistor (a second NMOS transistor). The reference character R1 to R4 indicate resistance elements (load resistances). In particular, the values of both the resistance elements (a first load resistance and a second load resistance) R1 and R2 are same. The reference character Is is a constant current source. The reference number 10 designates a CMOS-LCML conversion section for converting a level of a positive CMOS voltage potential to a level of a negative LCML voltage potential. The reference characters NM and NMB designate connection nodes.

In particular, both the PMOS transistors MP1 and MP2 and both the NMOS transistors MN1 and MN2 form a CMOS output circuit 100 for providing signals of a complementary level to the CMOS-LCML conversion section 10. Back gates of the NMOS transistors MN1 to MN4 are connected to their sources, respectively.

Figure 4:
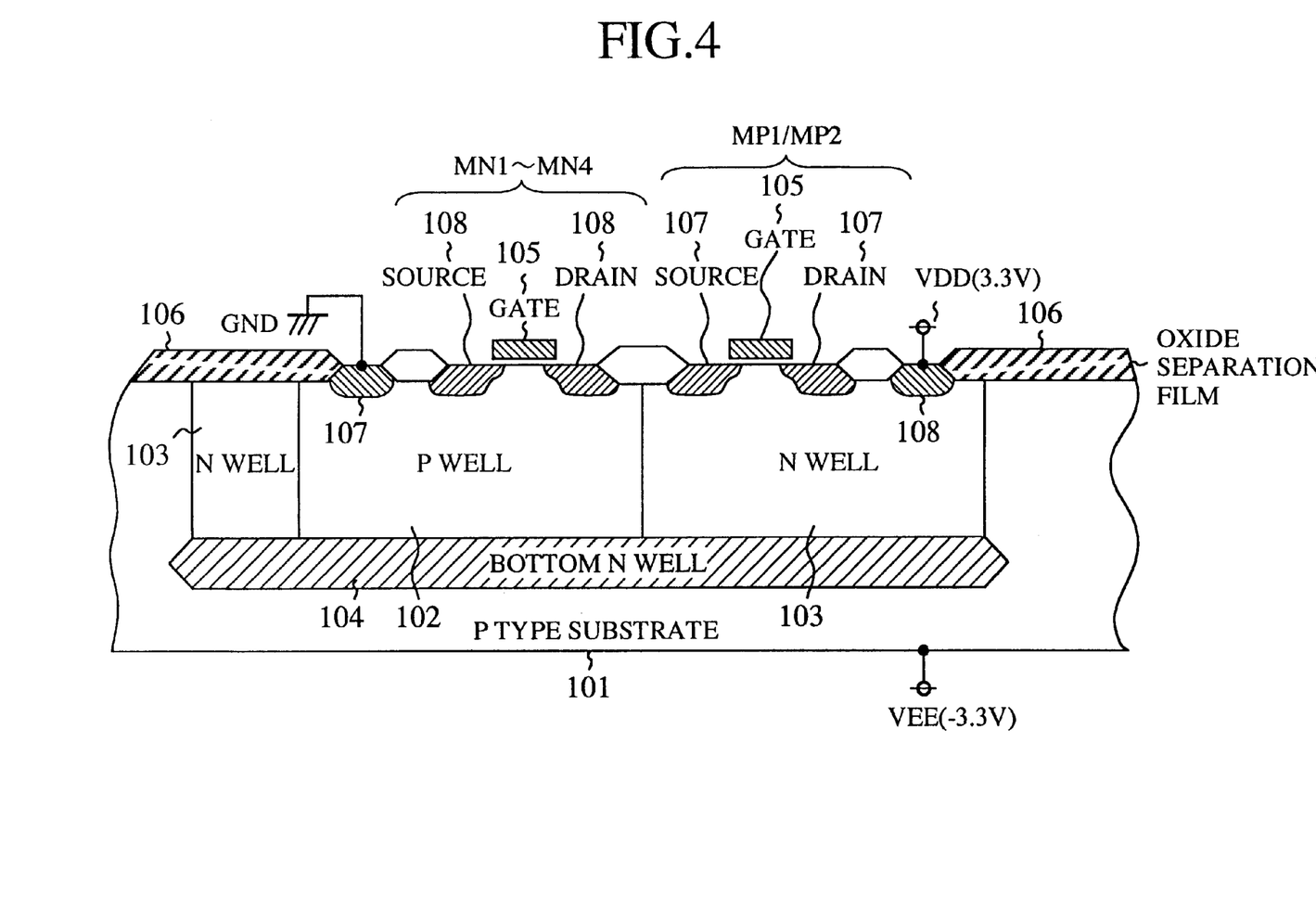
FIG. 4 is a sectional diagram showing NMOS transistors and PMOS transistors forming the level conversion circuit as the semiconductor integrated circuit according to the first embodiment shown in FIG. 3.

FIG. 4 is a sectional diagram showing the NMOS transistors and the PMOS transistors forming the level conversion circuit as the semiconductor integrated circuit according to the first embodiment shown in FIG. 3. In FIG. 4, the reference number 100 designates a P conductivity type semiconductor substrate, 102 denotes a P well, 103 indicate a N well, 104 designates a bottom N well, 105 designates a gate terminal, 106 indicate an oxide separation film, 107 and 108 denote source/drain terminals of the PMOS transistors and the NMOS transistors.

The semiconductor integrated circuit of the first embodiment is the level conversion circuit for converting CMOS level signals into negative LCML level signals.

In the level conversion circuit of the first embodiment, the gate terminals of the NMOS transistors NM3 and NM4 connected to the load resistances R1 and R2 in parallel are connected directly to the nodes MNB and NM. It is thereby possible that the CMOS-LCML conversion section in the level conversion circuit may input the CMOS output signals directly. Furthermore, the level conversion circuit further comprises a pair of the bipolar transistors Q1 and Q2 connected to the load resistances R1 and R2 and the NMOS transistors MN3 and MN4 in series. This configuration causes to reduce the delay time of a level conversion operation and to perform at a high speed rate.

Next, a description will now be given of the operation of the level conversion circuit as the first embodiment shown in FIG. 3.

First, the operation of the CMOS-LCML conversion section 10 will be explained. In an initial state, the level of a voltage potential at the node NMB that will be the input voltage potential of the CMOS-LCML conversion section 10 is the same of that of the node NM. Next, the description will explain the case in which the voltage potential of the node NMB is increased and the voltage potential of the node NM is decreased. In the following explanation, the explanation for a case is omitted. In the case, the voltage potential of the node NMB is decreased and the voltage potential of the node NM is increased. Because the configuration and the operation of the CMOS-LCML conversion section 10 in the case is the same as the former case.

In the initial state, when the voltage potential of the node NMB is the same as that of the node NM (namely, when the case in which the voltage potentials of both the gate terminals of the NMOS transistors MN3 and MN4 are same), the current value flows through each of the bipolar transistors Q1 and Q2 has Is/2 and the voltage potentials of both the source terminals of the NMOS transistors MN3 and MN4 become equal.

In this situation, when the voltage potential of the node NMB is reduced, the resistance values of the NMOS transistor MN3 and the resistance element R1 connected in parallel is decreased when comparing with the value in the initial state and the voltage potential of the source terminal of the NMOS transistor MN3 is increased because the voltage potential between the gate and the source of the NMOS transistor MN3 is increased (namely, a conductance of the NMOS transistor MN3 is increased). In addition, when the voltage potential of the node NM is decreased, the resistance values of the NMOS transistor MN4 and the load resistance R2 is decreased when comparing with the value in the initial state because the voltage potential between the gate and the source of the NMOS transistor MN4 is decreased. As a result, the voltage potential of the source terminal of the NMOS transistor MN4 is decreased.

When the voltage potential of the source terminal of the NMOS transistor MN3 is decreased, a voltage potential that is lower than the voltage potential of the NMOS transistor MN3 by the voltage potential VBE is provided to the base terminal of the bipolar transistor Q2 by the bipolar transistor Q4. Thereby, because the magnitude of a collector current of the bipolar transistor Q2 is increased, the voltage potential of the source terminal of the NMOS transistor MN4 is further decreased.

When the voltage potential of the source terminal of the NMOS transistor MN4 is decreased, a voltage potential that is lower than the voltage potential of the NMOS transistor MN4 by VBE is provided to the base terminal of the bipolar transistor Q1 by the bipolar transistor Q3. Thereby, because the voltage potential of the bipolar transistor Q1 is decreased and the magnitude of the collector current of the bipolar transistor Q1 is decreased, the voltage potential of the source terminal of the NMOS transistor MN3 is further decreased.

The distribution of the constant current Is is determined by a voltage difference between the base terminals of the bipolar transistors Q1 and Q2. When the voltage potential of the source terminal of the NMOS transistor MN3 is higher than that of the source terminal of the NMOS transistor MN4, the constant current Is flows through the bipolar transistor Q2, rather than through the bipolar transistor Q1. That is, the voltage potential of the collector of the bipolar transistor Q2 is reduced and the voltage potential of the collector of the bipolar transistor Q1 is increased. Then, when the flow of the current is completely switched, all of the constant current Is flows through the bipolar transistor Q2.

The voltage potential of the LCML non-inverted output terminal 2 in the CMOS-LCML conversion section 10 is reduced, from the ground voltage potential GND, by a voltage drop determined by the constant current Is and the NMOS transistor MN4 and the load resistance R2 connected in parallel. Thus, the voltage potential of the non-inverter output terminal 2 is becomes the L level (for example, −3.0 V), and the voltage potential of the non-inverted output terminal 3 becomes the H level (namely, the ground potential).

The CMOS-LCML conversion section 10 has a configuration of a positive feedback (PFB) and the voltage level of each of the non-inverted output terminals 2 and 3 has the L level (−0.3 V) or the H level (ground voltage potential GND).

The level conversion circuit of the first embodiment as a semiconductor integrated circuit shown in FIG. 3 has the configuration including the CMOS output circuit 100 comprising the PMOS transistors MP1 and MP2 and the NMOS transistors MN1 and MN2 and the CMOS output circuit 100 outputs complementary level signals into the CMOS-LCML conversion section 10.

Accordingly, when the voltage potential of the positive CMOS input terminal 1 is the L level, the voltage potential of the LCML non-inverted output terminal 2 becomes the L level (for example, −0.3 V). On the other hand, the voltage potential of the LCML non-inverted output terminal 2 is the H level (ground voltage potential GND). In addition, when the voltage potential of the positive CMOS input terminal 1 is the H level, the voltage potential of the LCML non-inverted output terminal 2 becomes the H level (ground voltage potential GND). On the other hand, the voltage potential of the LCML non-inverted output terminal 3 becomes the H level (−0.3 V).

As described above, according to the level conversion circuit of the first embodiment, the NMOS transistors MN3 and MN4 connected to the load resistances R1 and R2 in parallel are directly driven by using the complementary level signals provided from the CMOS output circuit 100. It is thereby possible to perform within a small delay time because the number of stages of gates is smaller than that of the conventional level conversion circuit shown in FIG. 1. Furthermore, it is thereby possible to reduce the power consumption and to increase the degree of the integration of the semiconductor integrated circuit as the level conversion circuit. That is, it is thereby possible to reduce the total power consumption of the level conversion circuit because no penetrate current (that corresponds to the data current Is flowing in the conventional level conversion circuit shown in FIG. 1) flows from the voltage potential VDD of the power source to the voltage potential VEE of the power source.

Second Embodiment

Figure 5:
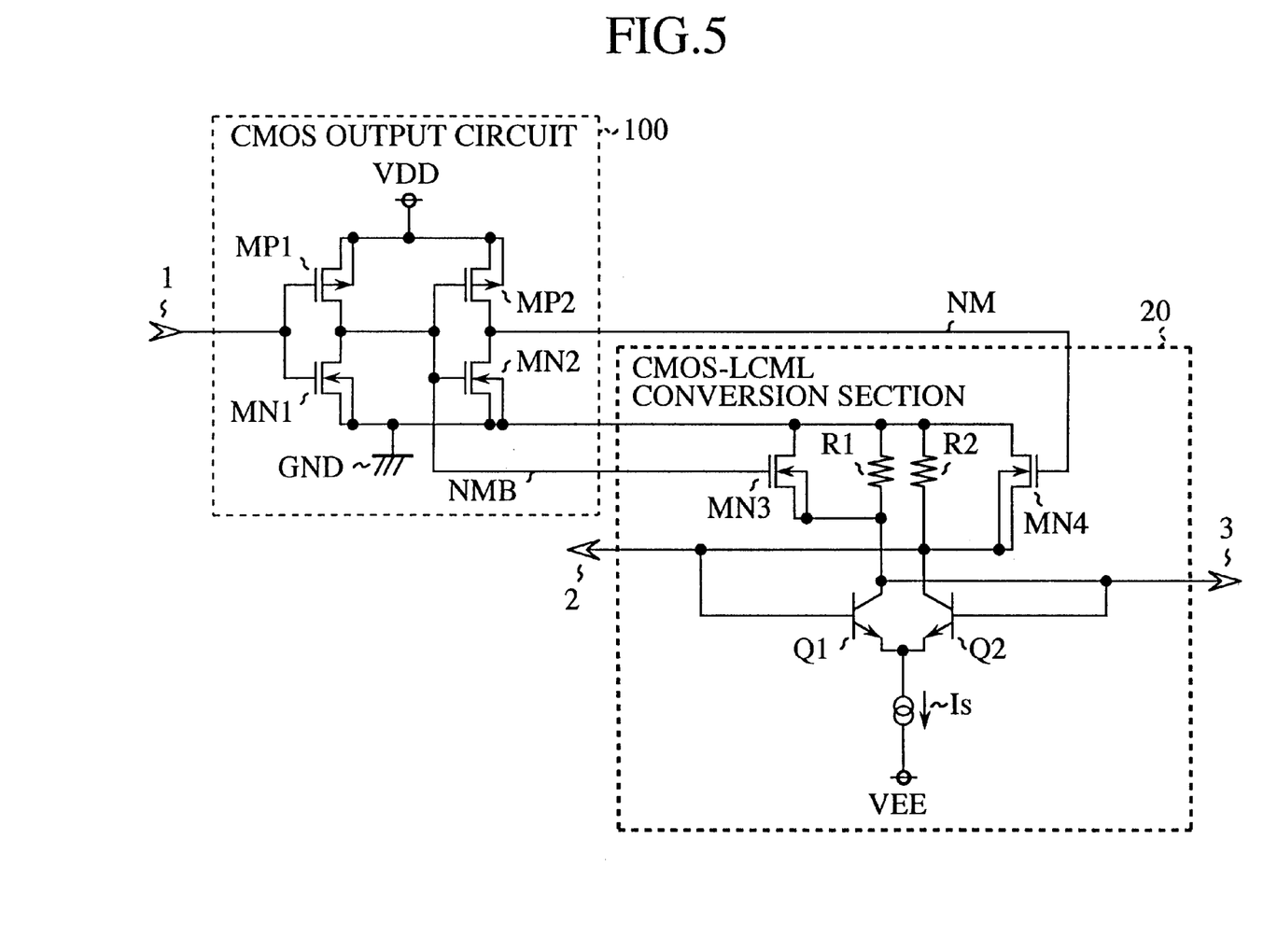
FIG. 5 is a circuit diagram showing a configuration of a level conversion circuit as a semiconductor integrated circuit according to the second embodiment of the present invention.

FIG. 5 is a circuit diagram showing a configuration of a level conversion circuit (as a semiconductor integrated circuit) according to the second embodiment of the present invention. In FIG. 5, the reference number 20 designates a CMOS-LCML conversions section. The CMOS-LCML conversion section 20 has the configuration in which the bipolar transistors Q3 and Q4 and the load resistances R3 and R4 incorporated in the CMOS-LCML conversion section 10 of the first embodiment are eliminated. Other components in the level conversion circuit of the second embodiment are the same as those of the level conversion circuit of the first embodiment, therefore, the explanation for the same components is omitted here for brevity.

The level conversion circuit of the second embodiment is capable of converting positive CMOS level signals into negative LCML level signals within a small delay time at a high speed rate.

Next, a description will now be given of the operation of the level conversion circuit as the second embodiment of the present invention.

The operation of the level conversion circuit of the second embodiment is the same as that of the level conversion circuit of the first embodiment. In the level conversion circuit of the first embodiment, the level of the voltage potential that is obtained by subtracting the voltage potential VBE from the voltage potential of the source terminals of the NMOS transistors MN3 and MN4 is provided to the base terminals of the bipolar transistors Q1 and Q2 under the operation of the bipolar transistors Q3 and Q4 that are incorporated in order to prevent the saturation of the bipolar transistors Q1 and Q2. On the other hand, it is not required to incorporate the bipolar transistors Q3 and Q4 because the level conversion circuit of the second embodiment performs the LCML level conversion. Accordingly, the level conversion circuit of the second embodiment shown in FIG. 5 has no bipolar transistors Q3 and Q4. Furthermore, the voltage potentials of the source terminals of the NMOS transistors MN3 and MN4 are directly inputted into the base terminals of the bipolar transistors Q1 and Q2, respectively, in the level conversion circuit of the second embodiment.

As described above, according to the level conversion circuit of the second embodiment, like the first embodiment, both the NMOS transistors MN3 and MN4 connected to the load resistances R1 and R2 in parallel are directly driven by using the complementary level signals as the CMOS level signal provided from the CMOS output circuit 100. It is thereby possible to further reduce the power consumption and to increase the degree of the integration of the semiconductor integrated circuit because the number of the gates is smaller and the delay time is also smaller when comparing with the conventional level conversion circuit as shown in FIG. 1.

Third Embodiment

Figure 6:
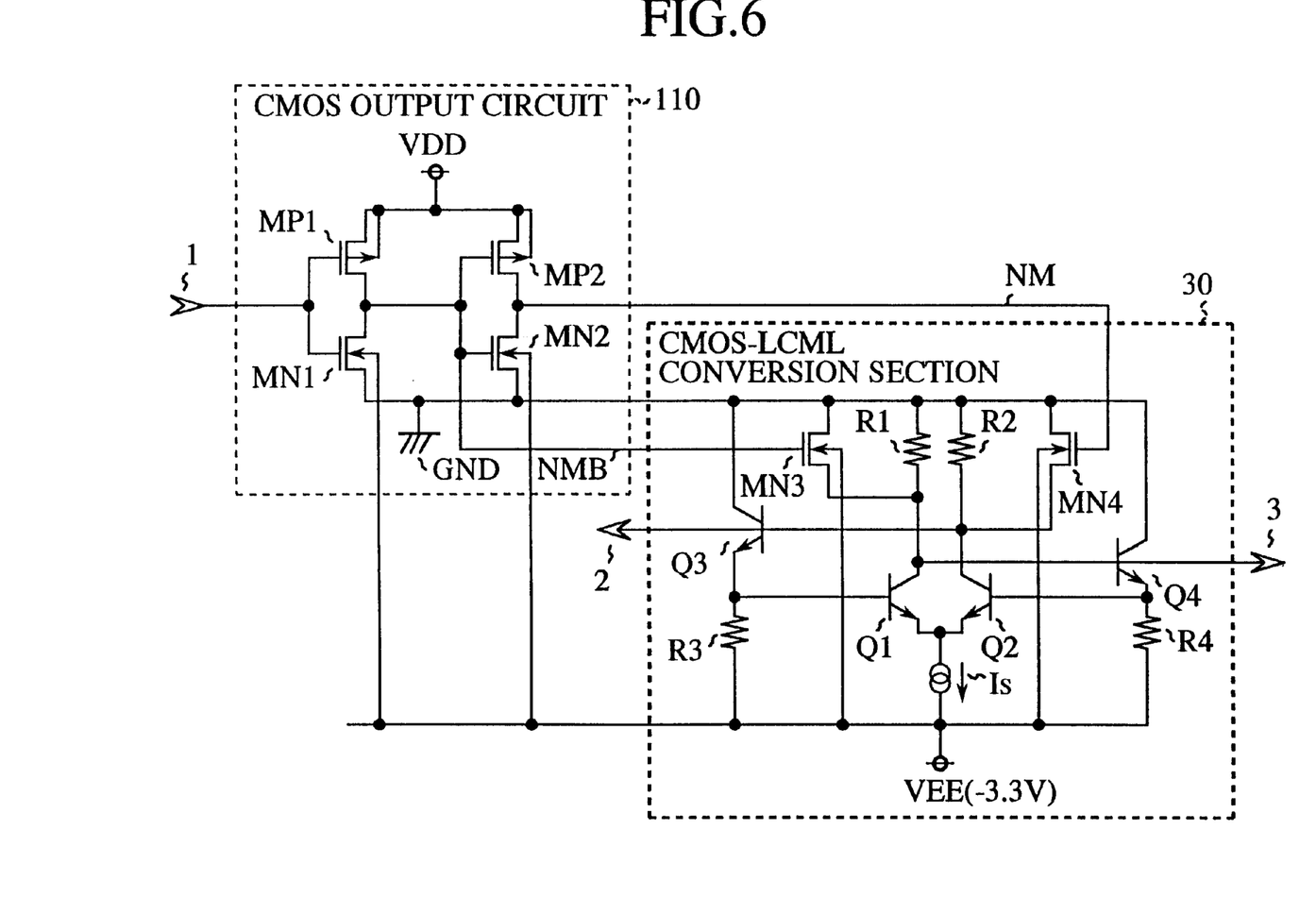
FIG. 6 is a circuit diagram showing a configuration of a level conversion circuit as a semiconductor integrated circuit according to the third embodiment of the present invention.

FIG. 6 is a circuit diagram showing a configuration of a level conversion circuit (as a semiconductor integrated circuit) according to the third embodiment of the present invention. In FIG. 6, the reference number 30 designates a CMOS-LCML conversion circuit, and 110 denotes a CMOS output circuit. The level conversion circuit of the third embodiment has the configuration in which the back gate of each of the NMOS transistors MN1 to MN4 in the level conversion circuit of the first embodiment shown in FIG. 3 is connected to the voltage potential VEE (−3.3 V) of a negative power source. Other components of the level conversion circuit of the third embodiment are the same as those of the level conversion circuit as the first embodiment, therefore, the explanation of those components is omitted here for brevity.

Figure 7:
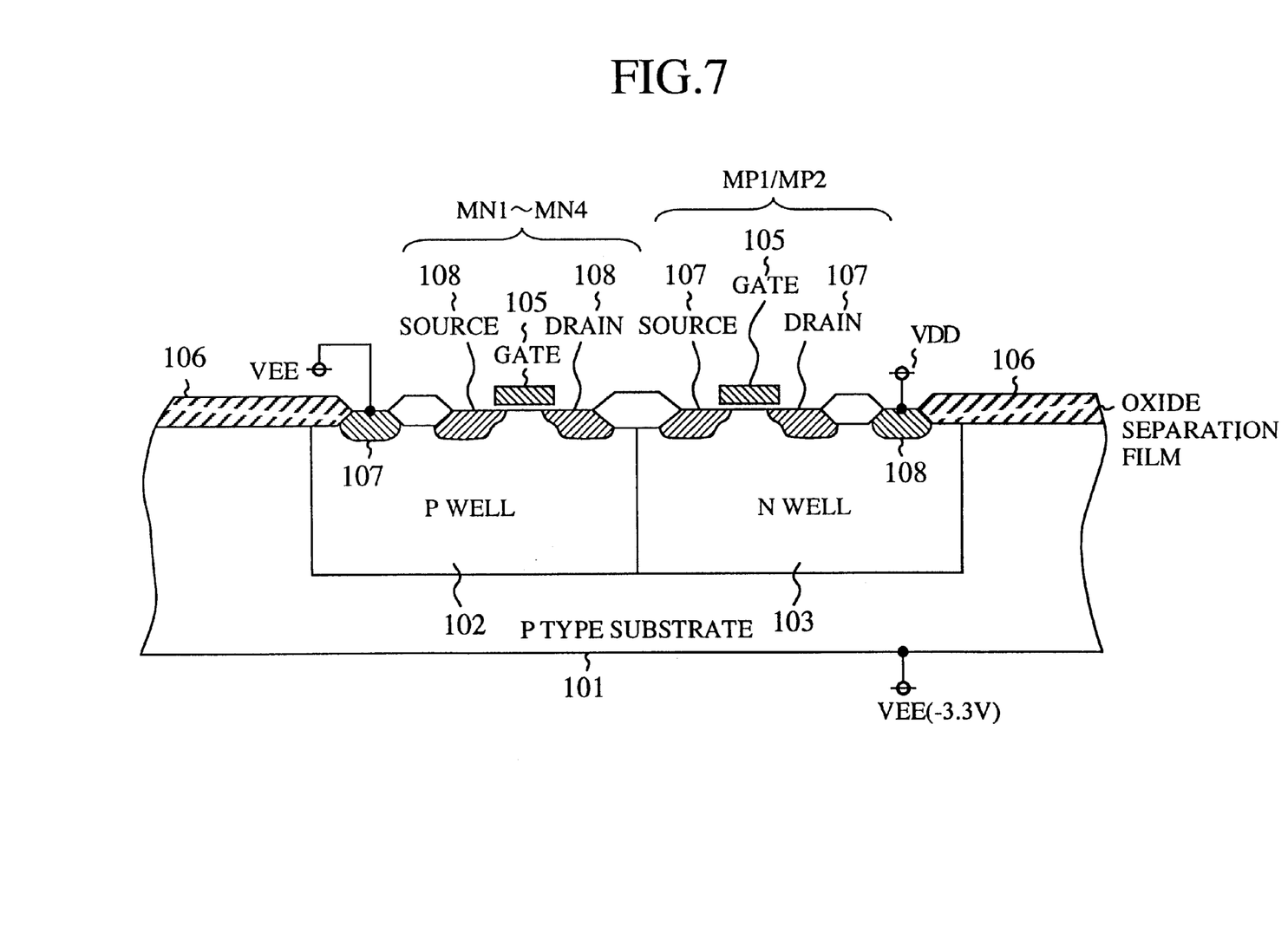
FIG. 7 is a sectional diagram showing NMOS transistors and PMOS transistors forming the level conversion circuit as the semiconductor integrated circuit according to the third embodiment shown in FIG. 6.

FIG. 7 is a sectional diagram showing each of the NMOS transistors MN1, MN2, MN3, MN4 and the PMOS transistors MP1 and MP2 forming the level conversion circuit as the semiconductor integrated circuit according to the third embodiment shown in FIG. 6. In FIG. 7, the reference number 101 is a P type semiconductor substrate, 102 denotes a P well, 103 indicates a N well, 105 designates a gate terminal, 106 denotes an oxide separation film, 107 and 108 denote source/drain terminals of the PMOS transistor and source/drain terminals of the NMOS transistors, respectively. In the level conversion circuit of the third embodiment, as shown in FIG. 7, it is not required to fabricate the bottom N well 104 that is incorporated in the level conversion circuit of the first embodiment shown in FIG. 4 because the back gate of each of the NMOS transistors MN1 to MN4 is connected to the voltage potential VEE of the negative power source. It is thereby possible to eliminate the fabrication process of the bottom N well 104.

Thus, in the third embodiment, it is possible to reduce the number of fabrication processes of the level conversion circuit by eliminating the fabrication process of the bottom N well because the back gate of each of the NMOS transistors MN1 to MN4 is connected to the voltage potential VEE (−3.3 V) of the negative power source.

Next, a description will be given of the operation of the level conversion circuit as the third embodiment of the present invention.

The operation of the level conversion circuit of the third embodiment is the same as that of the level conversion circuit of the first embodiment shown in FIG. 3, therefore the explanation of it is omitted here.

Because the level conversion circuit of the third embodiment has the configuration in which the back gate of each of the NMOS transistors MN1 to MN4 is connected to the voltage potential VEE (−3.3 V) of the negative power source, it is not required to separate the P well 102 of the NMOS transistors MN1 to MN4 from the P type semiconductor substrate 101, namely, it is not required to fabricate the bottom N well 104.

As described above, according to the level conversion circuit of the third embodiment, the back gate of each of the NMOS transistors MN1 to MN4 is connected to the voltage potential VEE (−3.3 V) of the negative power source. It is thereby possible to reduce the number of fabrication processes and to reduce the fabrication cost of the semiconductor integrated circuit in addition to the effect of the first embodiment, because it is not required to electrically separate the p well 102 of the NMOS transistors MN1 to MN4 from the P type semiconductor substrate 101 in the fabrication processes.

Fourth Embodiment

Figure 8:
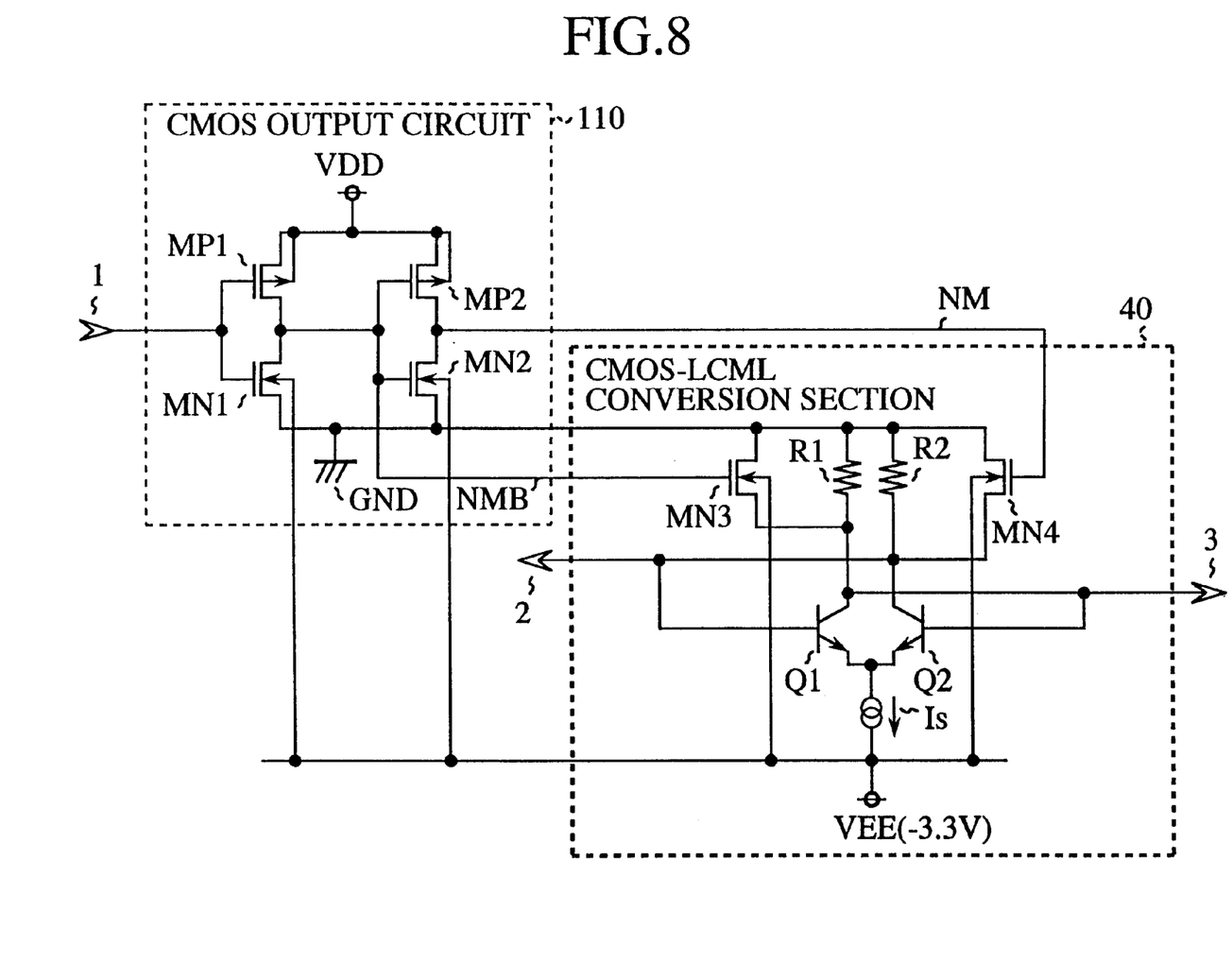
FIG. 8 is a circuit diagram showing a configuration of a level conversion circuit as a semiconductor integrated circuit according to the fourth embodiment of the present invention.

FIG. 8 is a circuit diagram showing a configuration of a level conversion circuit (as a semiconductor integrated circuit) according to the fourth embodiment of the present invention. In FIG. 8, the reference number 40 designates a CMOS-LCML conversion section. The level conversion circuit of the fourth embodiment has the configuration in which the back gate of each of the NMOS transistors MN1 to MN4 in the level conversion circuit of the second embodiment shown in FIG. 5 is connected to the voltage potential VEE (−3.3 V) of the negative power source. Other components are the same as those of the level conversion circuit of the second embodiment, therefore, the explanation of those components is omitted here for brevity.

The level conversion circuit of the fourth embodiment is capable of converting positive CMOS level signals into negative LCML level signals within a small delay time at a high speed rate. This function may be achieved by the configuration in which the back gate of each of the NMOS transistors MN1 to MN4 is connected to the voltage potential VEE (−3.3 V) of the negative power source and the region of the bottom N well 104 shown in the sectional diagram of the NMOS transistor shown in FIG. 7 is not required.

Next, a description will be given of the operation of the level conversion circuit of the fourth embodiment of the present invention.

The operation of the level conversion circuit of the fourth embodiment is the same as that of the level conversion circuit of the second embodiment shown in FIG. 5, therefore the explanation of it is omitted here.

In the level conversion circuit of the fourth embodiment, as shown in FIG. 8, the back gate of each of the NMOS transistors MN1 to MN4 is connected to the voltage potential VEE (−3.3 V) of the negative power source. Thereby, it is not required to form the bottom N well 104 because it is not required to electrically separate the P well of the NMOS transistors MN1 to MN4 from the P type semiconductor substrate 101.

As described above, according to the level conversion circuit of the fourth embodiment, the back gate of each of the NMOS transistors MN1 to MN4 is connected to the voltage potential VEE (−3.3 V) of the negative power source. It is thereby possible to reduce the number of fabrication processes and to reduce the fabrication cost of the semiconductor integrated circuit in addition to the effect of the second embodiment, because it is not required to electrically separate the p well 102 of the NMOS transistors MN1 to MN4 from the P type semiconductor substrate 101 in the fabrication processes.

Fifth Embodiment

Figure 9:
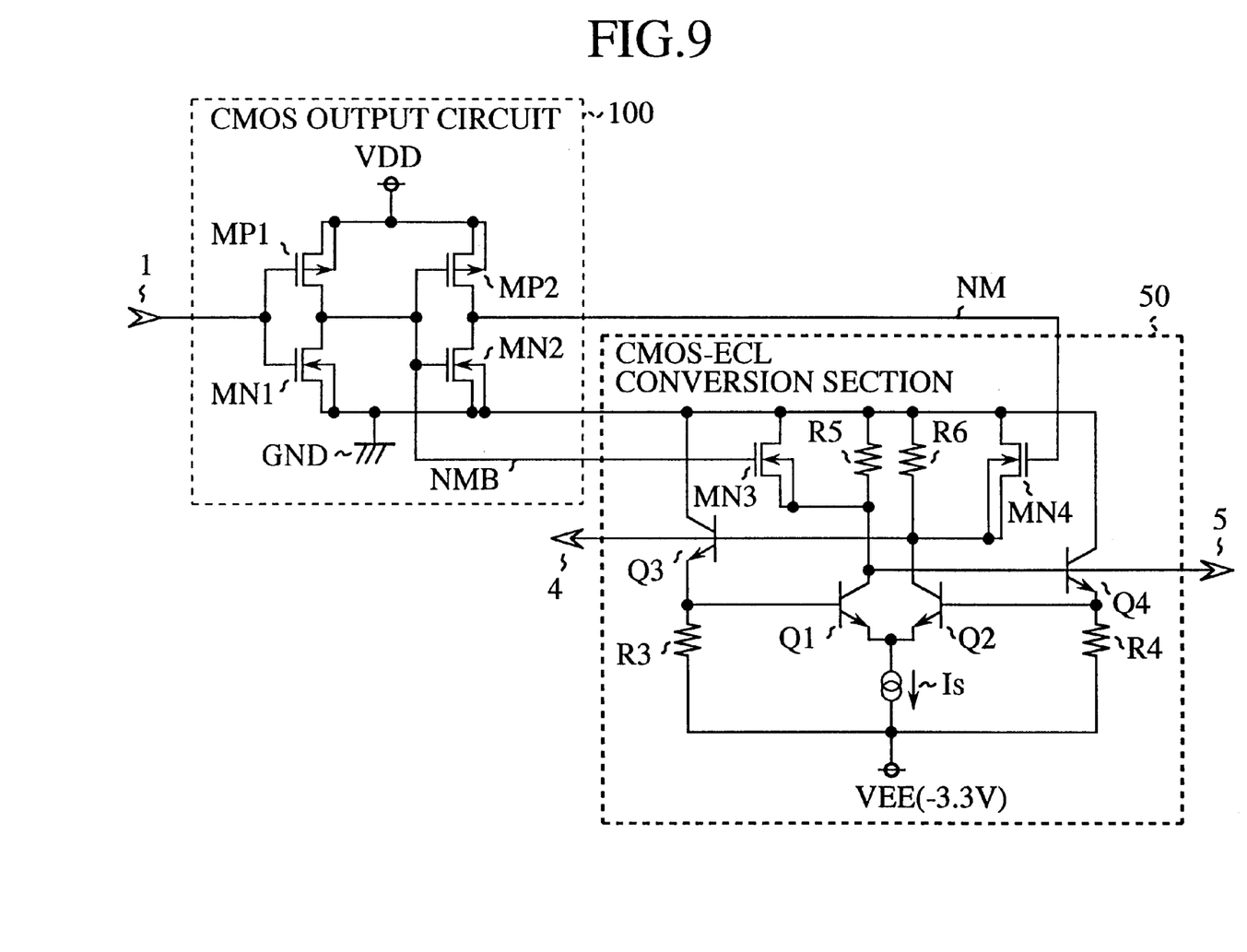
FIG. 9 is a circuit diagram showing a configuration of a level conversion circuit as a semiconductor integrated circuit according to the fifth embodiment of the present invention.

FIG. 9 is a circuit diagram showing a configuration of a level conversion circuit (as a semiconductor integrated circuit) according to the fifth embodiment of the present invention. In FIG. 9, the reference character VDD designates a voltage potential of a positive power source, VEE denotes a voltage potential of a negative power source, GND indicates a ground voltage. The reference number 1 designates an input terminal through which a positive CMOS level (for example, the H level is the positive voltage of the power source and the L level is the voltage of the ground voltage GND) is inputted. The reference character 4 denotes an non-inverted output terminal through which a negative ECL level signal (for example, the H level is −0.9 V and the L level is −1.7 V) is output, 5 indicates an non-inverted output terminal through which the ECL level signal is output. The reference characters R5 and R6 denote resistance elements (a first load resistance and a second load resistance, respectively) having a same resistance value. The reference character 50 designates a CMOS-ECL (emitter coupled logic) for converting positive CMOS level signals into negative ECL level signals. Other components are the same as those of the level conversion circuit of the first embodiment shown in FIG. 3, therefore, the explanation of those components is omitted here for brevity.

The level conversion circuit of the fifth embodiment is capable of converting positive CMOS level signals into negative ECL level signals within a small delay time at a high speed rate.

Next, a description will be given of the operation of the level conversion circuit of the fifth embodiment of the present invention.

Although the operation of the level conversion circuit of the fifth embodiment is basically the same as that of the level conversion circuit of the first embodiment shown in FIG. 3, the following matter is different between the fifth embodiment and the first embodiment:

In the level conversion circuit of the fifth embodiment, a voltage drop determined by an amplitude of the constant current Is determining the output amplitude and the NMOS transistors MN4 and the load resistance R6 is greater than that of the first to fourth embodiments. For example, it becomes 0.8 V. Accordingly, the voltage potential of the ECL non-inverted output terminal 4 and the ECL non-inverted output terminal 5 becomes −0.9 V as the H level and −1.7 V as the L level.

Because the level conversion circuit of the fifth embodiment outputs negative ECL level signals, it is possible to connect the level conversion circuit of the fifth embodiment directly to devices of the ECL level.

As described above, according to the level conversion circuit of the fifth embodiment, because the NMOS transistors MN3 and MN4 connected to the load resistances R5 and R6 in parallel are driven directly by using complementary level signals that are provided from the CMOS output circuit 100, it is possible to reduce the number of the stages of gates when comparing with the conventional level conversion circuit shown in FIG. 1. it is thereby possible to reduce the power consumption and to increase the degree of the integration of the semiconductor integrated circuit and to perform the ECL level conversion operation at a high speed rate. That is, although the magnitude of the current flowing through the bipolar transistors Q3 and Q4 is increasing, no penetrate current flows from the voltage potential VDD of the power source to the voltage potential VEE (that corresponds to the data current Is1 flowing in the conventional level conversion circuit shown in FIG. 1). It is thereby possible to reduce the power consumption of the level conversion circuit. Furthermore, because the negative ECL level signals are output, it is possible to directly connect the level conversion circuit of the fifth embodiment to devices of the ECL level.

Sixth Embodiment

Figure 10:
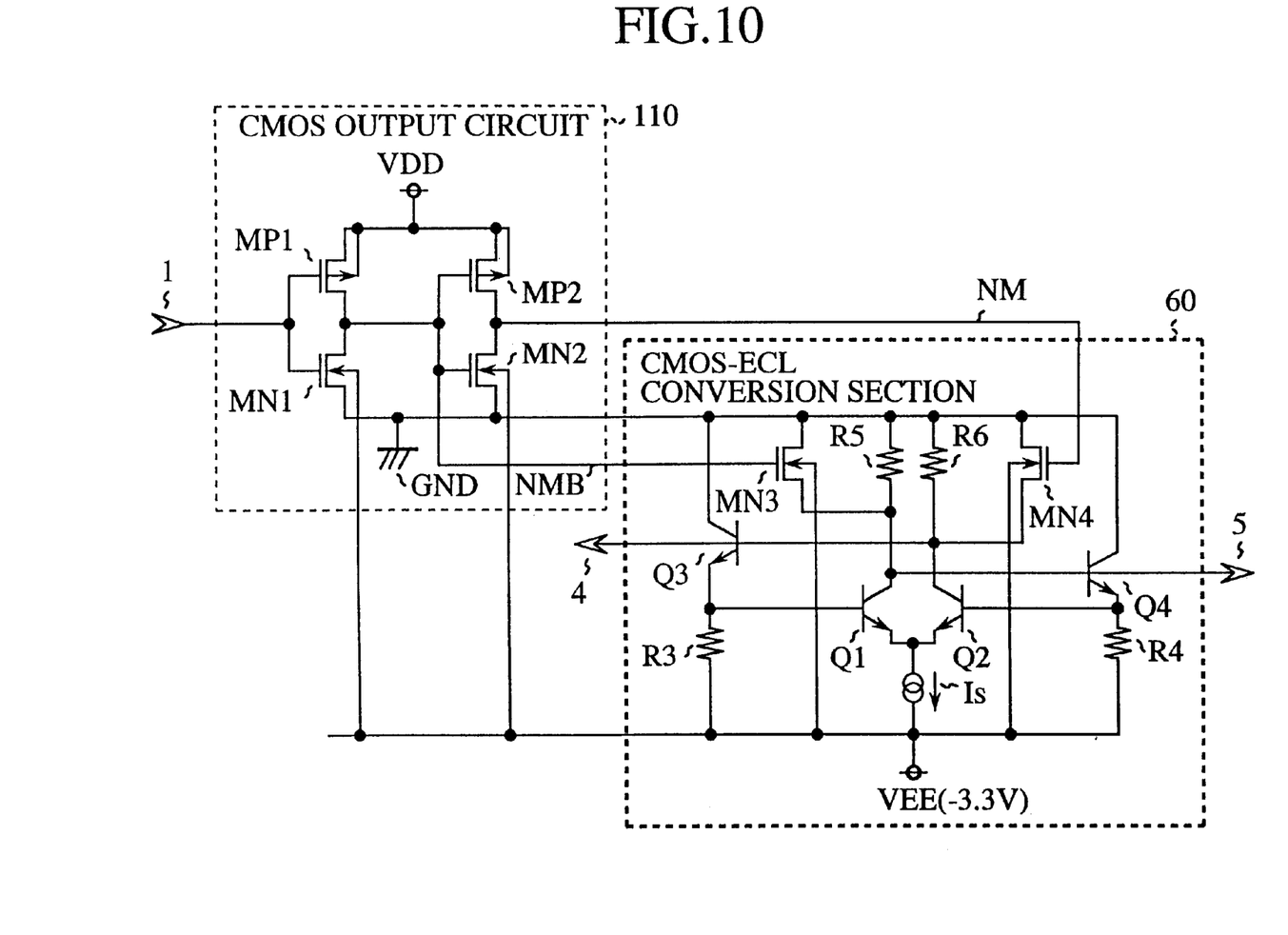
FIG. 10 is a circuit diagram showing a configuration of a level conversion circuit as a semiconductor integrated circuit according to the sixth embodiment of the present invention.

FIG. 10 is a circuit diagram showing a configuration of a level conversion circuit as a semiconductor integrated circuit according to the sixth embodiment of the present invention. In FIG. 10, the reference number 60 designates a CMOS-ECL conversion circuit, and 110 denotes a CMOS circuit. The level conversion circuit of the sixth embodiment has the configuration in which the back gate of each of the NMOS transistors MN1 to MN4 in the level conversion circuit of the fifth embodiment shown in FIG. 9 is connected to the voltage potential VEE of the negative power source (−3.3 V). Other components are the same as those of the level conversion circuit of the fifth embodiment shown in FIG. 9, therefore, the explanation of those components is omitted here for brevity.

In addition, as shown in FIG. 7, the level conversion circuit of the fifth embodiment does not require the bottom N well 104 shown in FIG. 4 because the back gate of each of the NMOS transistors MN1 to MN4 is connected to the voltage potential VEE of the negative power source. It is thereby possible to eliminate the fabrication process of the bottom N well 104 shown in FIG. 4.

The level conversion circuit of the sixth embodiment is capable of converting positive CMOS level signals to negative ECL level signals. In addition, the bottom N well 104 is not required in configuration because the back gate of each of the NMOS transistors MN1 to MN4 is connected to the voltage potential VEE (−3.3 V) of the negative power source. It is thereby possible to eliminate the number of the fabrication processes of the level conversion circuit.

Next, a description will be given of the operation of the level conversion circuit of the sixth embodiment of the present invention.

The operation of the level conversion circuit of the sixth embodiment is the same as that of the level conversion circuit of the fifth embodiment shown in FIG. 9. That is, a voltage drop determined by an amplitude of the constant current Is determining the output amplitude and the NMOS transistors MN4 and the load resistance R6 are greater than those of the first to fourth embodiments. For example, it becomes 0.8 V. Accordingly, the voltage potential of the ECL non-inverted output terminal 4 and the ECL non-inverted output terminal 5 becomes −0.9 V as the H level and −1.7 V as the L level. The level conversion circuit of the sixth embodiment may directly connect devices of the ECL level because it can output negative ECL level signals.

In addition, in the level conversion circuit of the sixth embodiment, it is not required to electrically separate the P well 102 of the NMOS transistors MN1 to MN4, as shown in FIG. 4, from the P type semiconductor substrate 101 because the back gate of each of the NMOS transistors MN1 to MN4 is connected to the voltage potential VEE (−3.3 V) of the negative power source. It is thereby possible to fabricate the bottom N well 104, as shown in FIG. 4, for example.

As described above, according to the level conversion circuit of the sixth embodiment, it is possible to directly connect the level conversion circuit to devices of the ECL level because the level conversion circuit may output negative ECL level signals. In addition, because the level conversion circuit of the sixth embodiment has the configuration in which the back gate of each of the NMOS transistors MN1 to MN4 is connected to the voltage potential VEE (−3.3 V) of the negative power source, it is not required to electrically separate the P well 102 of the NMOS transistors MN1 to MN4 from the P type semiconductor substrate 101 in addition to the effect of the fifth embodiment. That is, it is not required to fabricate the bottom N well 104 during the semiconductor fabrication processes. It is thereby possible to reduce the number of fabrication processes and to reduce the fabrication cost of semiconductor integrates circuits.

As described above in detail, according to the present invention, a semiconductor integrated circuit comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, and a first bipolar transistor and a second bipolar transistor connected in series to the pair of the first NMOS transistor and the first load resistance connected in parallel and the pair of the second NMOS transistor and the second load resistance connected in parallel, respectively. In the semiconductor integrated circuit, both emitters of the first bipolar transistor and the second bipolar transistor are connected commonly and a voltage potential that is lower than a voltage potential of a collector of the first bipolar transistor by a predetermined voltage potential is supplied into a base of the second bipolar transistor. It is thereby possible to obtain the effect that the positive CMOS level signals of a positive feed back may be converted into negative LCML level signals within a small delay time at a high speed rate and to reduce the power consumption of the semiconductor integrated circuit.

In addition, according to the present invention, the semiconductor integrated circuit further comprises a third bipolar transistor whose base is connected to a source of the second NMOS transistor and whose emitter is connected to a base of the first bipolar transistor, and a fourth bipolar transistor whose base is connected to a collector of the first bipolar transistor and for providing a voltage potential that is lower than a voltage potential of the collector of the first bipolar transistor into a base of the second bipolar transistor. It is thereby possible to obtain the effect that the CMOS level signals of a positive feed back may be converted into negative LCML level signals within a small delay time at a high speed rate and to reduce the power consumption of the semiconductor integrated circuit.

Furthermore, according to the present invention, a semiconductor integrated circuit comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, a first bipolar transistor connected in series to the pair of the first NMOS transistor and the first load resistance connected in parallel, and a second bipolar transistor connected in series to the pair of the second NMOS transistor and the second load resistance connected in parallel. In the semiconductor integrated circuit, both emitters of the first bipolar transistor and the second bipolar transistor are connected commonly, and a voltage potential of a collector of the first bipolar transistor is provided into a base of the second bipolar transistor. It is thereby possible to obtain the effect that the positive CMOS level signals of a positive feed back may be converted into negative LCML level signals within a small delay time at a high speed rate and to reduce the power consumption of the semiconductor integrated circuit.

Moreover, according to the present invention, a semiconductor integrated circuit comprises a first load resistance and a second load resistance, a first N conductivity type metal oxide semiconductor (NMOS) transistor and a second NMOS transistor, connected to the first load resistance and the second load resistance in parallel, respectively, that are driven directly by positive CMOS level signals, a first bipolar transistor connected in series to the pair of the first NMOS transistor and the first load resistance connected in parallel, and a second bipolar transistor connected in series to the pair of the second NMOS transistor and the second load resistance connected in parallel. In the semiconductor integrated circuit, both emitters of the first bipolar transistor and the second bipolar transistor are connected commonly, and a voltage potential that is lower than a voltage potential of a collector of the first bipolar transistor by a predetermined voltage potential is provided into a base of the second bipolar transistor. It is thereby possible to obtain the effect that the positive CMOS level signals of a positive feed back may be converted into negative ECL level signals within a small delay time at a high speed rate and to reduce the power consumption of the semiconductor integrated circuit.

In addition, according to the present invention, both back gates of the first NMOS transistor and the second NMOS transistor are connected directly to a voltage potential of a power source. It is thereby possible to obtain the effect that the number of fabrication processes for the semiconductor integrated circuit may be reduced.

Furthermore, according to the present invention, a source and a back gate of the first NMOS transistor are connected to each other, and a source and a back gate of the second NMOS transistor are connected to each other. It is thereby possible to obtain the effect that the positive CMOS level signals of the positive feed back may be converted into negative LCML level signals or negative ECL level signals within a small delay time at a high speed rate.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit comprising:

a first load resistance and a second load resistance;

a first N conductivity type metal oxide semiconductor (NMOS) transistor and a second NMOS transistor, connected to the first load resistance and the second load resistance in parallel, respectively, that are driven directly by positive complementary metal oxide semiconductor (CMOS) level signals; and a first bipolar transistor and a second bipolar transistor connected in series to the pair of the first NMOS transistor and the first load resistance connected in parallel and the pair of the second NMOS transistor and the second load resistance connected in parallel, respectively, wherein both emitters of the first bipolar transistor and the second bipolar transistor are connected commonly and a voltage potential that is lower than a voltage potential of a collector of the first bipolar transistor by a predetermined voltage potential is supplied into a base of the second bipolar transistor so that the positive CMOS level signals of a positive feed back are converted into negative LCML level signals.

2. A semiconductor integrated circuit as claimed in claim 1, further comprises a third bipolar transistor whose base is connected to a source of the second NMOS transistor and whose emitter is connected to a base of the first bipolar transistor; and a fourth bipolar transistor whose base is connected to a collector of the first bipolar transistor and for providing a voltage potential that is lower than a voltage potential of the collector of the first bipolar transistor into a base of the second bipolar transistor.

3. A semiconductor integrated circuit, comprising:

a first load resistance and a second load resistance;

a first N conductivity type metal oxide semiconductor (NMOS) transistor and a second NMOS transistor, connected to the first load resistance and the second load resistance in parallel, respectively, that are driven directly by positive CMOS level signals;

a first bipolar transistor connected in series to the pair of the first NMOS transistor and the first load resistance connected in parallel; and a second bipolar transistor connected in series to the pair of the second NMOS transistor and the second load resistance connected in parallel, wherein both emitters of the first bipolar transistor and the second bipolar transistor are connected commonly, and a voltage potential of a collector of the first bipolar transistor is provided into a base of the second bipolar transistor so that the positive CMOS level signals of a positive feed back are converted into negative LCML level signals.

4. A semiconductor integrated circuit comprising:

a first load resistance and a second load resistance;

a first N conductivity type metal oxide semiconductor (NMOS) transistor and a second NMOS transistor, connected to the first load resistance and the second load resistance in parallel, respectively, that are driven directly by positive CMOS level signals;

a first bipolar transistor connected in series to the pair of the first NMOS transistor and the first load resistance connected in parallel; and a second bipolar transistor connected in series to the pair of the second NMOS transistor and the second load resistance connected in parallel, wherein both emitters of the first bipolar transistor and the second bipolar transistor are connected commonly, and a voltage potential that is lower than a voltage potential of a collector of the first bipolar transistor by a predetermined voltage potential is provided into a base of the second bipolar transistor so that the positive CMOS level signals of a positive feed back are converted into negative ECL level signals.

5. A semiconductor integrated circuit as claimed in claim 1, wherein both back gates of the first NMOS transistor and the second NMOS transistor are connected directly to a voltage potential of a power source.

6. A semiconductor integrated circuit as claimed in claim 2, wherein both back gates of the first NMOS transistor and the second NMOS transistor are connected directly to a voltage potential of a power source.

7. A semiconductor integrated circuit as claimed in claim 3, wherein both back gates of the first NMOS transistor and the second NMOS transistor are connected directly to a voltage potential of a power source.

8. A semiconductor integrated circuit as claimed in claim 4, wherein both back gates of the first NMOS transistor and the second NMOS transistor are connected directly to a voltage potential of a power source.

9. A semiconductor integrated circuit as claimed in claim 1, wherein a source and a back gate of the first NMOS transistor are connected to each other, and a source and a back gate of the second NMOS transistor are connected to each other.

10. A semiconductor integrated circuit as claimed in claim 2, wherein a source and a back gate of the first NMOS transistor are connected to each other, and a source and a back gate of the second NMOS transistor are connected to each other.

11. A semiconductor integrated circuit as claimed in claim 3, wherein a source and a back gate of the first NMOS transistor are connected to each other, and a source and a back gate of the second NMOS transistor are connected to each other.

12. A semiconductor integrated circuit as claimed in claim 4, wherein a source and a back gate of the first NMOS transistor are connected to each other, and a source and a back gate of the second NMOS transistor are connected to each other.

* * * * *